(12) United States Patent
Huber et al.

(10) Patent No.: US 9,196,321 B2
(45) Date of Patent: Nov. 24, 2015

(54) ON-DIE TERMINATION APPARATUSES AND METHODS

(71) Applicant: Micron Technology, Inc., Boise, ID (US)

(72) Inventors: Brian W. Huber, Allen, TX (US); Vijay Vankayala, Plano, TX (US); Brian Gross, Boise, ID (US); Gary Howe, Plano, TX (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 14/045,521

(22) Filed: Oct. 3, 2013

(65) Prior Publication Data

US 2015/0098285 A1 Apr. 9, 2015

(51) Int. Cl.
*G11C 7/00* (2006.01)
*G11C 7/02* (2006.01)
*G11C 5/06* (2006.01)
*G11C 7/10* (2006.01)
*G11C 29/02* (2006.01)

(52) U.S. Cl.
CPC ....... *G11C 7/02* (2013.01); *G11C 5/063* (2013.01); *G11C 7/1057* (2013.01); *G11C 7/1084* (2013.01); *G11C 29/025* (2013.01); *G11C 29/028* (2013.01); *G11C 2207/105* (2013.01)

(58) Field of Classification Search
CPC ..................... G11C 29/028; G11C 29/50008
USPC ............................................ 365/198; 326/30
See application file for complete search history.

(56) References Cited

U.S. PATENT DOCUMENTS

| | | | |
|---|---|---|---|
| 7,180,327 B2* | 2/2007 | So et al. .......................... 326/30 |
| 2007/0247185 A1* | 10/2007 | Oie et al. ....................... 326/30 |
| 2008/0315913 A1* | 12/2008 | Kim ................................ 326/30 |
| 2013/0002291 A1* | 1/2013 | Park ............................... 326/30 |

* cited by examiner

*Primary Examiner* — Son Mai
(74) *Attorney, Agent, or Firm* — Schwegman Lundberg & Woessner, P.A.

(57) ABSTRACT

Apparatuses and methods are disclosed herein, including those, performed by a memory die, that operate to detect that a command on a bus connected to the memory die is addressed to another memory die responsive to a chip select signal, and to change the impedance of an on-die termination circuit of the memory die responsive to the detecting.

19 Claims, 7 Drawing Sheets

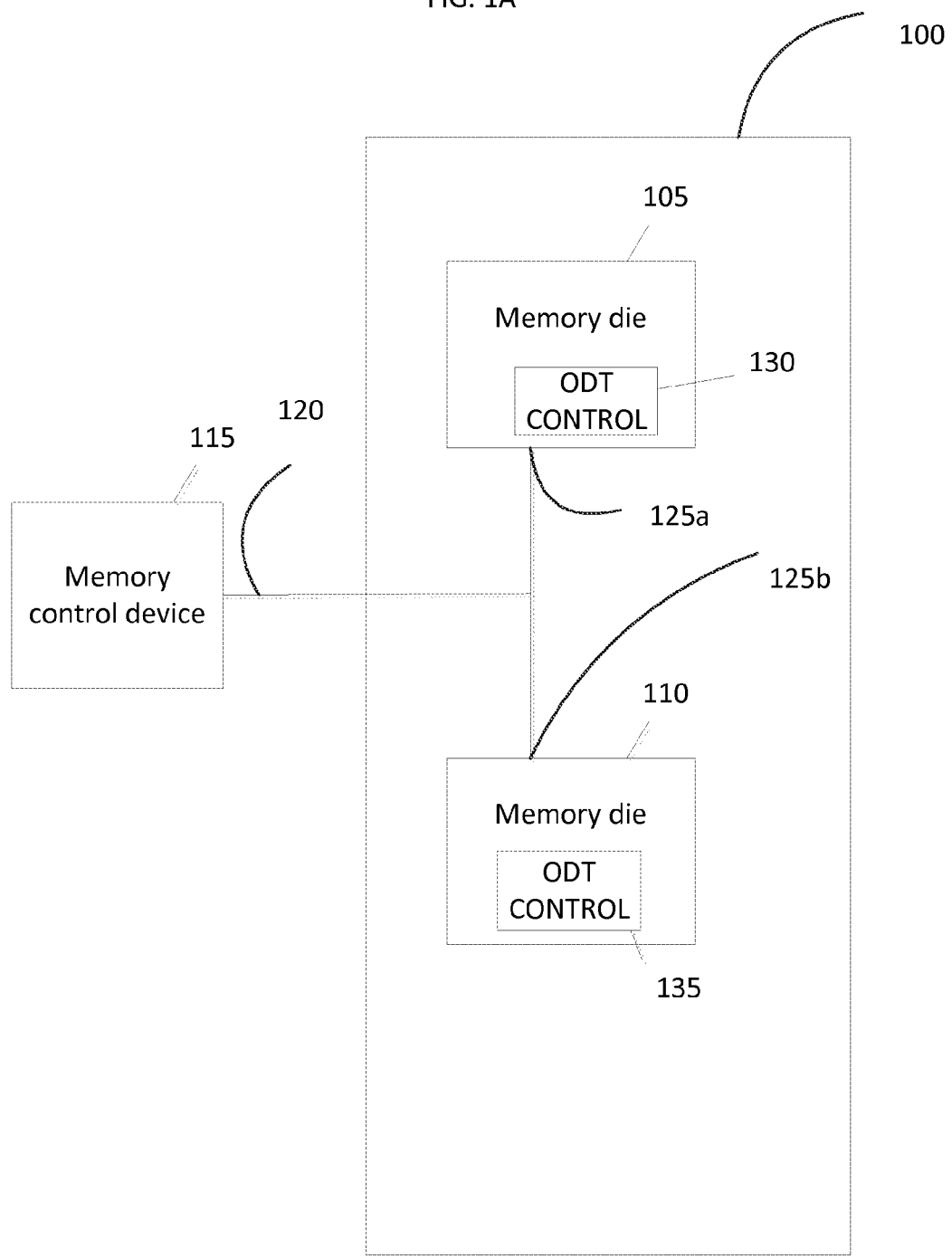

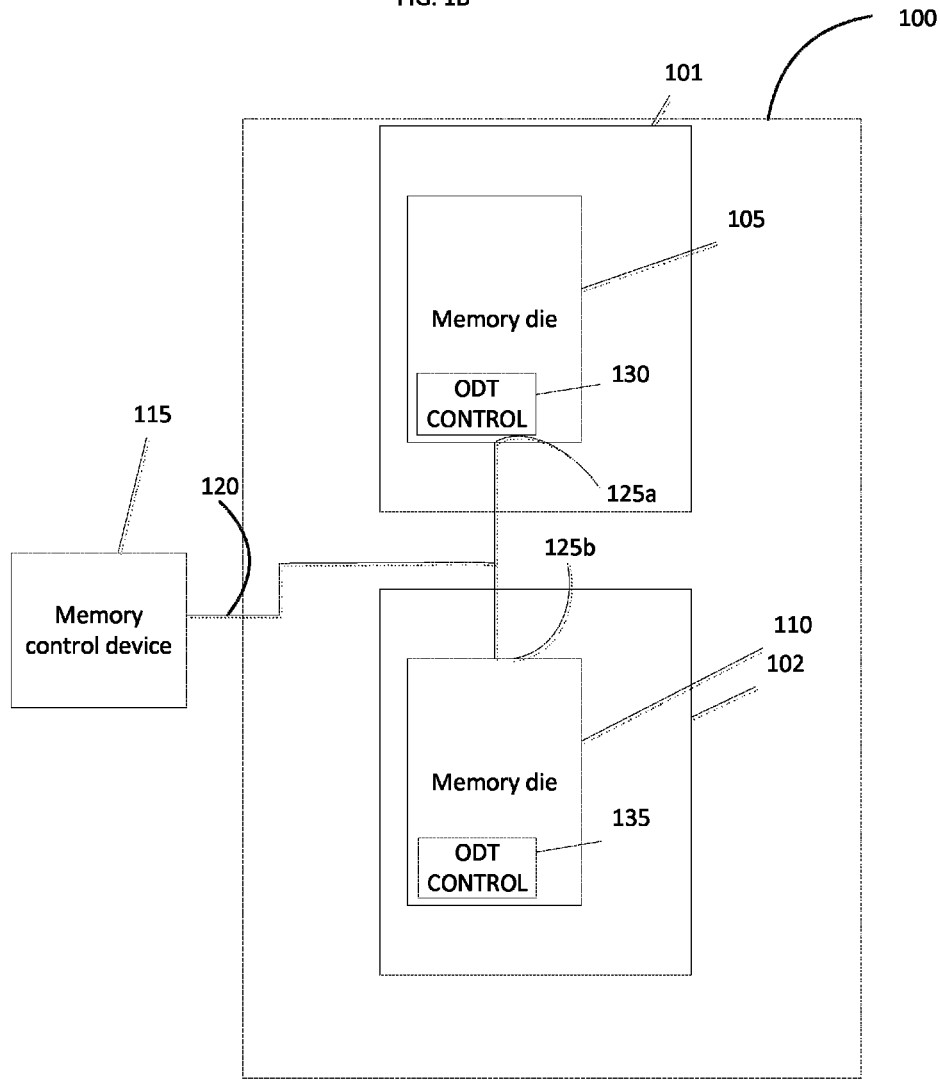

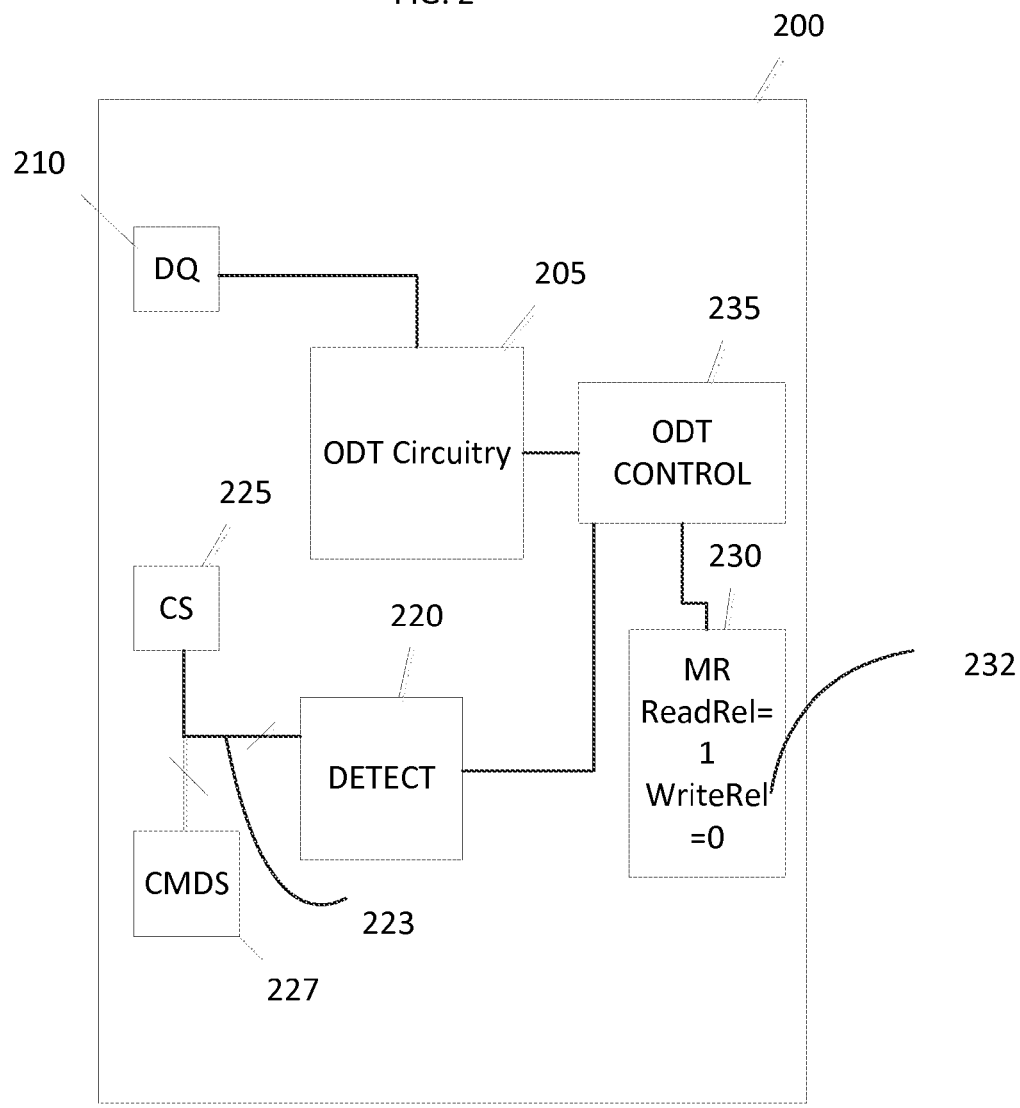

ON-DIE TERMINATION APPARATUSES AND METHODS

BACKGROUND

On-die termination (ODT) circuits may apply an impedance that operates to reduce reflections on a bus. When two or more memory die are on the bus and one memory die is transmitting on the bus, the other memory die sharing the bus may apply ODT to reduce reflections onto the bus. However, if the memory die are almost at the same point electrically the transmitter itself acts as termination at that point and the application of ODT by the other memory die only serves to attenuate the transmitter, thereby negatively affecting signal integrity.

BRIEF DESCRIPTION OF THE DRAWINGS

FIG. 1A is a block diagram of a memory device in the form of a dual die package (DDP) in accordance with some embodiments.

FIG. 1B is a block diagram of a memory device in the form of two single-die packages (SDPs) in accordance with some embodiments.

FIG. 2 is a partial block diagram of a memory die in accordance with some embodiments.

DETAILED DESCRIPTION

Figure 3:
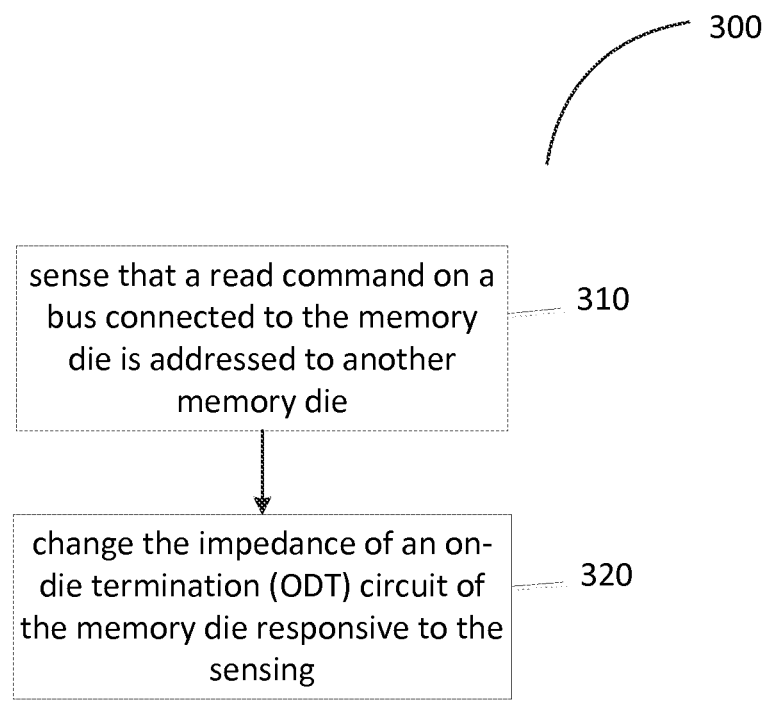
FIG. 3 is a flow diagram of a method for implementing a read ODT relinquish mode.

FIG. 1A is a block diagram of a memory apparatus that includes device 100 in the form of a dual die package (DDP). The memory device 100 includes two memory dies 105 and 110. Memory device 100 may include additional memory dies (not shown) forming, for example, quad die packages, (QDP), with four memory die, etc.

FIG. 1B is a block diagram of a memory apparatus with device 100 in the form of two single-die packages (SDPs) in which the memory die 105 and the memory die 110 are in separate memory packages 101 and 102 respectively. The memory package 101 and the memory package 102 are typically arranged in a "clam shell" configuration in which two packages, for example two SDPs, two DDPs or two QDPs, are placed on opposing sides of the same circuit board. This can minimize connection distances between the two packages, making it appear as though they are almost at the same point electrically (not shown in FIG. 1A or 1B).

In addition to embodiments depicted in FIGS. 1A and 1B, device 100 can include a single memory die 105 or 110 in a single package. In both FIGS. 1A and 1B, a memory control device 115 communicates with the memory dies 105 and 110 using a system bus 120 such that the memory dies 105 and 110 share some portions of system bus 120. System bus 120 may include any number of data lines, address lines, chip select lines, command lines, and other lines.

During device 100 operation, system bus 120 appears electrically to be a collection of transmission lines, with a propagation delay such that each point along system bus 120 is electrically separated in time. Endpoints and imperfections of the transmission lines may create reflections of the propagated signals if these endpoints and imperfections are not terminated properly. If the endpoints are at or nearly at the same point, for example if points 125a and 125b are close together, then a single termination at 125a or 125b may be sufficient to terminate both sides to reduce reflections.

Memory devices may use on-die termination (ODT) to further reduce reflections to help maintain signal integrity on system bus 120. When one of the memory dies 105, 110 is transmitting, for example if one of the memory dies 105, 110 receives a read command on system bus 120 and transmits the data being read, the other memory die 105, 110 sharing system bus 120 may use ODT to reduce or eliminate reflections at, for example, at one of connection points 125a, 125b.

However, if the non-transmitting memory die 105 or 110 (i.e., the die 105, 110 that is operating to implement ODT) is electrically near the transmitting die, it may mainly appear to be an attenuator of the transmitter, because the transmitting device has already performed effective termination as described above. This attenuation effect can result in deterioration of signal integrity.

Some embodiments provide methods for ODT relinquish that allow a memory die 105, 110 to deactivate ODT when another memory die 105, 110 is transmitting. ODT relinquish as described with respect to some embodiments is based on the identity of the commands sent to the memory dies 105 and 110 and on mode register (MR) settings for one or more of the memory dies 105 and 110. Because control for ODT relinquish operations can be achieved by the memory dies 105 and 110 themselves, without relying on communications or control from other devices, some embodiments may perform ODT relinquish operations relatively quickly, to comply with stricter time constraints of certain memory devices 100, 101, and 102.

According to some embodiments, the memory dies 105 and 110 may include dynamic random access memory (DRAM) devices or synchronous dynamic random access memory (SDRAM) devices. Other types of memory may be used. While FIGS. 1A and 1B illustrate two memory dies 105 and 110, and one memory control device 115, some embodiments may include several memory dies and memory control devices. As will be described in more detail below with respect to FIGS. 2-6, one or both of the memory dies 105 and 110 may include ODT control circuitry 130 and 135 respectively. For example, the memory die 105 may include ODT control circuitry 130 and the memory die 110 may include second ODT control circuitry 135.

FIG. 2 is a partial block diagram of a memory die 200 in accordance with some embodiments. The memory die 200 may be operable to serve as either of the memory die 105, 110 (FIGS. 1A and 1B). The memory die 200 includes ODT circuitry 205. The memory die 200 can be included with another memory die in a memory device 100 (FIG. 1) or the memory die 200 can itself serve as a memory device 100.

In some dual-ranked, dual die packages, memory dies can directly detect chip select (CS) commands, for example by examining a state of CS inputs, directed to other memory dies of the package. This may occur because of the existence of a dummy load node on one memory die that is shared with the other memory die's chip select node. Alternately, memory die 200 can through sensing and examination of the chip select node 225 and other commands 227, detect whether commands on command bus 223 are addressed to another memory die. For example, the memory die 200 may detect deselected read commands or deselected write commands to detect whether commands are addressed to other memory dies. In addition to the CS command, commands 227 used for the deselected read can include, but is not limited to, Write Enable (WE) and Refresh (REF). An example selected read command to a memory die 200 can have CS=Active, WE=Inactive, REF=Inactive. A deselected read command to a memory die 200 can have CS=Inactive, WE=Inactive, and REF=Inactive.

Some embodiments may provide methods for ODT relinquish in accordance with one or more ODT relinquish modes. Indicators of the ODT relinquish mode may be stored in, for example, an MR 230. The MR 230 may store a value indicating the ODT relinquish mode that the memory die 200 will use for operating ODT circuitry 205. For example, the MR 230 may include data 232 indicating whether read relinquish or write relinquish is enabled. The memory control device 115 (FIGS. 1A and 1B) may program the MR 230 on initialization of the memory device 100 (FIGS. 1A and 1B). While some ODT relinquish modes are described below with respect to FIGS. 3-6, embodiments are not limited thereto.

The memory die 200 may include control circuitry 235 to change the impedance of the ODT circuitry 205 responsive to detecting that commands on command bus 223 are addressed to another memory die and responsive to detecting of the mode for operating the ODT circuitry 205. For example, the ODT circuitry may include resistors connected in parallel with one or more transistors (not shown in FIG. 2) that may be selectively turned on or off to set the impedance of the ODT circuitry 205. The impedance may be in a range including of about 30 to 120 ohms, but embodiments are not limited thereto. Control circuitry 235 may include circuits near the center of the die with signals to fan out to DQ regions 210. Control circuitry 235 may further include circuitry local to a DQ 210 that turns off that DQ 210 ODT circuitry independently of other ODT settings in response to an output time.

FIG. 3 is a flow diagram of a method 300 for implementing a Read ODT relinquish mode. The method 300 may be implemented by a memory die 105, 110 (FIGS. 1A and 1B) or by a memory die 200 (FIG. 2). The method 300 may be implemented in other dies, devices, and apparatuses. For example, the method 300 may be implemented by a memory die 105, 110 that forms a one-die memory device 100 (FIGS. 1A and 1B).

In operation 310, the memory die 200 may detect that a read command on a system bus 120 (FIGS. 1A and 1B), connected to the memory die 200, is addressed to another, different memory die. The memory die 200 may detect this by detecting another die's chip select command, for example a state of a CS input to another die, through a dummy load node. Alternatively, the memory die 200 may detect this by detecting a deselected read command, indicating that the read command is addressed to another memory die.

In operation 320, the memory die 200 may change the impedance of on-die termination (ODT) circuitry 205 of the memory die 200 responsive to detecting that the read command is addressed to the other memory die. The memory die 200 may change the impedance of the ODT circuitry 205 by deactivating the ODT circuitry 205 or by increasing the impedance of the ODT circuitry 205. The memory die 200 may deactivate the ODT circuitry 205 of the memory die 200 coincident to the other memory die placing data on the system bus 120 (FIGS. 1A and 1B).

The memory die 200 may change the impedance of the ODT circuitry 205 on a rising edge of a system clock, or the memory die 200 may change the impedance of the ODT circuitry 205 on a falling edge of the system clock. A programmable element option on the memory die 200 may be used to set whether the memory die 200 changes impedance of the ODT circuitry 205 on the rising edge or the falling edge of the system clock. In some embodiments, if the memory die 200 deactivates the ODT circuitry 205 on a falling edge of the system clock, this may result in ODT circuitry 205 being deactivated for more clock cycles than would be the case if the memory die 200 deactivated the ODT circuitry 205 on a rising edge of the system clock.

The memory die 200 may reactivate the ODT circuitry 205 responsive to detecting that the other memory die has completed responding to the read command. The other memory die that is being read from may maintain its own separate ODT circuitry in an active state until the other memory die puts data on the system bus 120. At that point, the other memory die that is being read may deactivate ODT circuitry at the corresponding DQ where the read is occurring. When MR information indicates the read ODT relinquish mode is active, both the memory die 200 and the other memory die may maintain their respective ODT circuitry in an active state when writes are occurring to either memory die.

Figure 4:
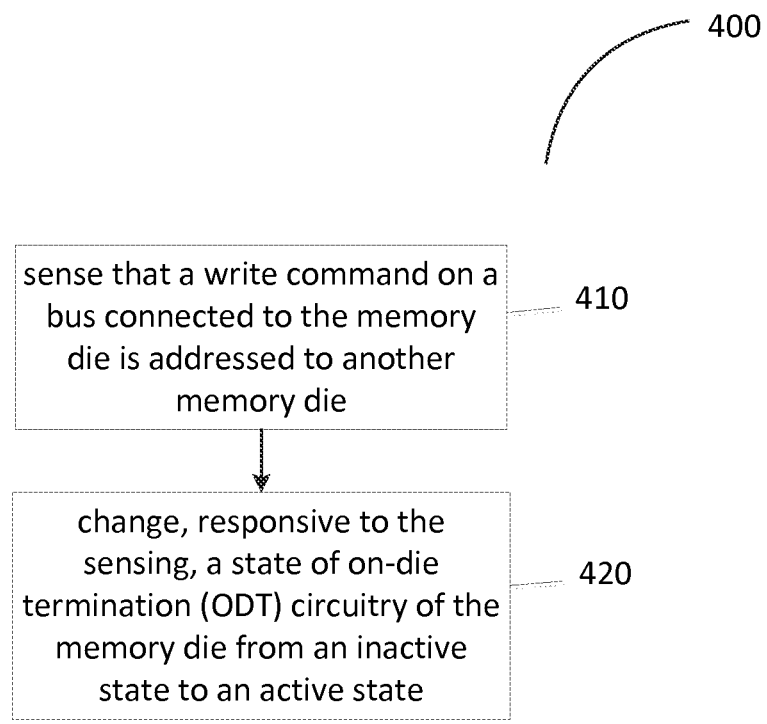
FIG. 4 is a flow diagram of a method for implementing a write other ODT relinquish mode.

FIG. 4 is a flow diagram of a method 400 for implementing a Write Other ODT relinquish mode. The method 400 may be implemented by a memory die 105, 110 (FIGS. 1A and 1B) or by a memory die 200 (FIG. 2). The method 400 may be implemented in other dies, devices, and apparatuses. For example, the method 400 may be implemented by a memory die 105, 110 that forms a one-die memory device 100 (FIGS. 1A and 1B).

In operation 410, the memory die 200 may detect that a write command on a system bus 120 connected to the memory die 200 is addressed to another memory die. The memory die 200 may detect this by detecting another die's chip select command, for example a state of a CS input to another die, through a dummy load node. Alternatively, as described above with respect to FIG. 2, the memory die 200 may detect this by detecting a deselect write command based on memory die 200's own chip select node 225 and a command signal.

In operation 420, the memory die 200 may change the state of the ODT circuitry 205 of the memory die 200 from an inactive state to an active state, responsive to detecting that the write command is addressed to the other memory die. An inactive state may include a state in which the ODT circuitry 205 has a high impedance, for example near-infinite impedance, while an active state may include a state in which the ODT circuitry 205 has some other impedance, such as for example 60 ohms The other memory die may deactivate its own ODT circuitry at this point. The memory die 200 may then deactivate the ODT circuitry 205 responsive to detecting that the other memory die has completed responding to the write command. The memory die 200 may thereafter maintain the ODT circuitry 205 in a deactivated state until the memory die 200 detects a write command to the other memory die on the system bus 120 (FIGS. 1A and 1B).

When operating in at least the Write Other ODT relinquish mode, the memory die 200 may precondition a line of the system bus 120, for example a data line of the system bus 120 (FIGS. 1A and 1B), by activating the ODT circuitry 205 for a selectable duration, prior to write data or read data being applied to the bus. The memory die 200 may perform this preconditioning for approximately one clock cycle if the command is a write command while the memory die 200 may precondition for approximately one-half clock cycle if the command is a read command. The memory die 200 may precondition the line of the system bus 120 to guarantee or help ensure the existence of a known state on the system bus 120. This may be used to prevent situations in which the system bus 120 has leaked down to, for example zero volts (hard low) or up to the bus's associated supply voltage (hard high), which would not be levels normally seen on the system bus 120. In at least these situations, information first placed on the system bus 120 may appear corrupted or otherwise unusable by the memory die 200, the other memory die, or memory controller 115. Use of preconditioning by activating ODT circuitry 205 may draw the system bus 120 to a known state between, for example, 0.25 volts and 0.75 volts.

The memory die 200 may apply post-conditioning to the data line of the system bus 120 by activating the ODT circuitry 205 for a selectable duration responsive to completion of a response to a command addressed to the memory die 200.

Figure 5:
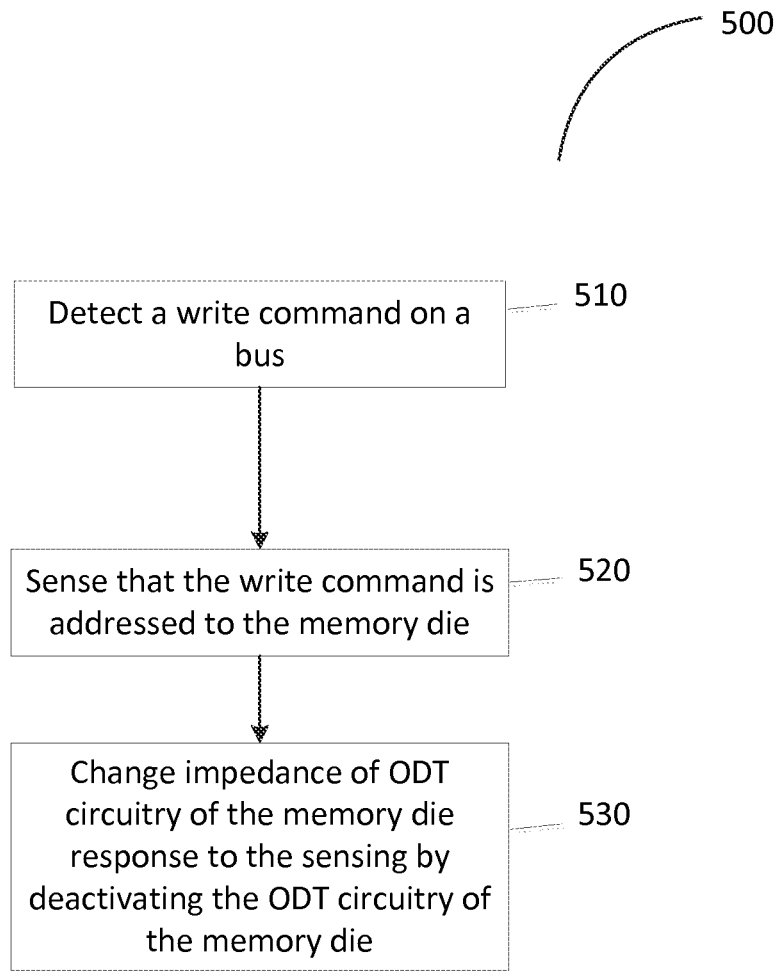
FIG. 5 is a flow diagram of a method for implementing a write ODT relinquish mode.

FIG. 5 is a flow diagram of a method 500 for implementing a Write ODT relinquish mode. The method 500 may be implemented by a memory die 105, 110 (FIGS. 1A and 1B) or by a memory die 200 (FIG. 2). The method 500 may be implemented in other dies, devices, and apparatuses. For example, the method 500 may be implemented by a memory die 105, 110 that forms a one-die memory device 100 (FIGS. 1A and 1B).

In operation 510, the memory die 200 may detect the existence of a write command on the command bus.

In operation 520, the memory die 200 may detect that the write command is addressed to the memory die 200. The memory die 200 may detect this, for example, by detecting a chip select command at a chip select node 225.

In operation 530, the memory die 200 may change impedance of the ODT circuitry 205 of the memory die 200 responsive to the detecting by deactivating the ODT circuitry 205. The memory die 200 may deactivate the ODT circuitry 205 at a point in time, coincident with or within no more than one clock cycle of, the time at which the memory die 200 is scheduled to respond to the write command. The memory die 200 may reactivate the ODT circuitry 205 responsive to completion of the response to the write command.

The memory die 200 may deactivate ODT circuitry 205 on a falling edge of the system clock in the write ODT relinquish mode. Because data eyes of write data may be centered on a rising edge of the system clock, deactivating ODT circuitry 205 on the falling edge may help avoid situations in which ODT circuitry 205 becomes activated in the middle of a first write data eye of a sequence of write data information.

When the memory die 200 is in the write ODT relinquish mode, during read operations, the memory die 200 may deactivate ODT circuitry local to DQs that are being read.

Figure 6:
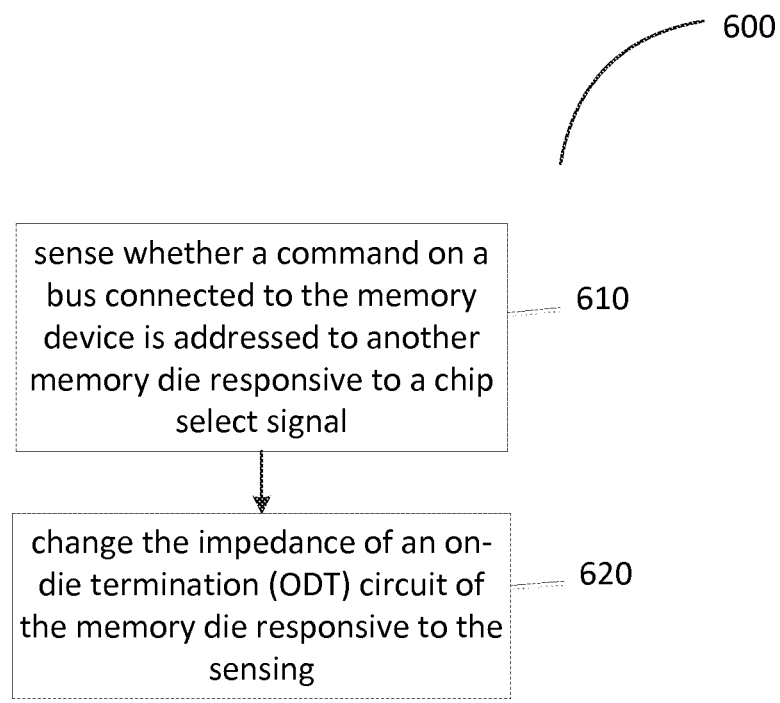
FIG. 6 is a flow diagram of a method for implementing an ODT relinquish mode.

FIG. 6 is a flow diagram of a method 600 for implementing an ODT relinquish mode. The method 600 may be implemented by a memory die 105, 110 (FIGS. 1 and 1B) or by a memory die 200 (FIG. 2). The method 600 may be implemented in other dies, devices, and apparatuses. For example, the method 600 may be implemented by a memory die 105, 110 that forms a one-die memory device 100 (FIGS. 1A and 1B).

In operation 610, the memory die 200 operates to detect whether a command on a bus connected to the memory die 200 is addressed to another memory die responsive to a chip select command. The memory die 200 may detect this situation, for example, by sensing and examining a chip select command at a chip select node 225, e.g., a state of CS inputs as described above. The command may include a read command or a write command.

In operation 620, the memory die 200 changes impedance of the ODT circuitry 205 of the memory die 200 responsive to the detecting. If the command is a write command, changing the impedance may comprise changing a state of the ODT circuitry 205 from an inactive state to an active state.

At least another ODT relinquish mode may be described with reference to memory dies 105 and 110 (FIGS. 1A and 1B). In an illustrative example embodiment, memory die 105 is being read from or written to. The memory die 105 may maintain its ODT circuitry in an active state until the respective read or write data is on the bus. The other memory die 110 may detect reads or writes to the memory die 105, and deactivate its own ODT circuitry when the memory die 105 puts data on the bus, but maintain ODT circuitry in an inactive state during writes to the memory die 105.

Modules described above in accordance with some embodiments may include hardware circuitry, optical components, single or multi-processor circuits, memory circuits, software program modules and objects encoded in a computer-readable medium (but not software listings), firmware, and combinations thereof, as desired by the architect of the memory device 100 and as appropriate for particular implementations of some embodiments, including system embodiments.

Some embodiments may comprise or be incorporated into electronic circuitry used in computers, communication and signal processing circuitry, single-processor or multi-processor modules, single or multiple embedded processors, multi-core processors, data switches, and application-specific modules including multilayer, multi-chip modules. Such apparatuses may further be included as sub-components within, for example, televisions, cellular telephones, personal computers (e.g., laptop computers, desktop computers, hand-held computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. An apparatus may be defined as circuitry, an integrated circuit die, a memory device, a memory array, or a system. Some embodiments may include a number of methods, as noted previously.

The above description and the drawings sufficiently illustrate some specific embodiments to enable those of ordinary skill in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A method performed by a memory die, the method comprising:
    detecting that a read command on a bus connected to the memory die is addressed to another memory die responsive to a chip select command; and
    changing the impedance of an on-die termination (ODT) circuit of the memory die, on a rising edge of a system clock and responsive to the detecting that the read command on the bus connected to the memory die is addressed to the other memory die.

2. The method of claim 1, wherein changing the impedance comprises deactivating the ODT circuit of the memory die.

3. The method of claim 2, wherein the deactivating is responsive to detecting that the other memory die has commenced responding to the read command.

4. The method of claim 3, further comprising reactivating the ODT responsive to detecting that the other memory die has completed responding to the read command.

5. A method performed by a memory die, the method comprising:

detecting that a read command on a bus connected to the memory die is addressed to another memory die responsive to a chip select command; and changing the impedance, on a falling edge of a system clock, of an on-die termination (ODT) circuit of the memory die responsive to the detecting that the read command on the bus connected to the memory die is addressed to the other memory die, wherein the memory die increases the impedance on a falling edge of a system clock responsive to the detecting.

6. A method performed by a memory die, the method comprising:

detecting that a write command on a bus connected to the memory die is addressed to another memory die responsive to a chip select signal;

changing, responsive to the detecting, a state of an on-die termination (ODT) circuit of the memory die from an inactive state to an active state; and preconditioning a data bus by activating the ODT circuit for a duration prior to write or read data being applied to the data bus, wherein the duration is approximately one clock cycle if the command is a write command and the duration is approximately one half clock cycle if the command is a read command.

7. The method of claim 6, further comprising, responsive to the changing, deactivating the ODT circuit responsive to detecting that the other memory die has completed responding to the write command; and maintaining the ODT circuit in a deactivated state.

8. The method of claim 6, further comprising:

post-conditioning a data bus by activating ODT for a duration responsive to completion of a response to a command addressed to the memory die.

9. An apparatus comprising:

a first memory die including first on-die termination (ODT) control circuitry;

a second memory die;

a bus connected to the first memory die and the second memory die, the bus shared between the first memory die and the second memory die;

a memory control device configured to communicate with the first memory die and the second memory die using the bus, the first memory die being configured to detect that a command on the bus is addressed to the second memory die responsive to a chip select signal, and to change the impedance of the first ODT of the first memory die responsive to the detecting, the first memory die further comprising a programmable element configured to enable circuitry for deactivating the ODT circuitry on a falling edge of a system clock when the programmable element is programmed.

10. The apparatus of claim 9, wherein the second memory die includes second ODT control circuitry separate from first ODT control circuitry.

11. The apparatus of claim 9, wherein the first memory die includes detection circuitry to detect whether commands on the bus are addressed to another memory die besides the first memory die responsive to a chip select signal; and a mode register (MR) configured to store a value indicating an operation mode for operating the ODT circuit responsive to the detecting.

12. The apparatus of claim 11, wherein the first ODT control circuitry is configured to change the impedance of the ODT circuit responsive to the detection and responsive to the operation mode.

13. An apparatus comprising:

on-die termination (ODT) circuitry;

detection circuitry to detect whether commands on a bus are addressed to another memory die responsive to a chip select signal;

a mode register (MR) configured to store a value indicating a mode for operating the ODT circuit responsive to the detecting;

control circuitry to change the impedance of the ODT circuitry responsive to the detection and responsive to the mode; and a programmable element, the programmable element configured to enable circuitry for deactivating the ODT circuitry on a falling edge of a system clock when the programmable element is programmed.

14. The apparatus of claim 13, wherein the control circuitry is configured to deactivate the ODT circuitry responsive to detecting that a read command on the bus is addressed to another memory die.

15. The apparatus of claim 13, wherein the control circuitry is configured to change a state of the ODT circuitry from an inactive state to an active state responsive to detecting that a write command on the bus is addressed to another memory die.

16. The apparatus of claim 15, wherein the control circuitry is configured to deactivate the ODT circuitry responsive to detecting that the other memory die has completed responding to the write command, and maintain the ODT circuitry in the inactive state until detection of subsequent write commands addressed to the other memory die.

17. A method performed by a memory die, the method comprising:

detecting that a command on a bus connected to the memory die is addressed to another memory die responsive to a chip select signal; and changing the impedance of an on-die termination (ODT) circuit of the memory die responsive to the detecting and on a rising edge of a system clock.

18. The method of claim 17, wherein the command is a read command.

19. The method of claim 17, wherein the command is a write command and changing the impedance comprises changing, responsive to the detecting, a state of the ODT circuitry of the memory die from an inactive state to an active state.

* * * * *